United States Patent [19]
Conboy et al.

[11] Patent Number: 5,560,775
[45] Date of Patent: Oct. 1, 1996

[54] QUARTZ MARKING SYSTEM

[75] Inventors: Michael R. Conboy, Buda; Michael D. Smith, Austin, both of Tex.

[73] Assignee: Advanced Micro Devices, Inc., Sunnyvale, Calif.

[21] Appl. No.: 247,331

[22] Filed: May 23, 1994

[51] Int. Cl.$^6$ .................................. C23C 16/00
[52] U.S. Cl. ............ 118/500; 118/728; 118/729; 206/459.5
[58] Field of Search .................. 118/728, 729, 118/500; 206/459.5

[56] References Cited

U.S. PATENT DOCUMENTS 5,442,561  8/1995  Yoshizawa .................... 364/468
5,445,271  8/1995  Kakizaka ..................... 206/459.5

Primary Examiner—Richard Bueker
Attorney, Agent, or Firm—Foley & Lardner

[57] ABSTRACT

The invention provides an improved apparatus for supporting a workpiece during the manufacturing process involving the workpiece. The apparatus includes a holding device for maintaining the workpiece in a predetermined orientation during performance of the manufacturing process. The holding device includes a plurality of members. The improvement comprises at least one member of the plurality of members including a plurality of indicators arranged in a predetermined order to establish an identifying code. Each indicator of the plurality of indicators absorbs a predetermined portion of incident light.

15 Claims, 3 Drawing Sheets

QUARTZ MARKING SYSTEM

BACKGROUND OF THE INVENTION

The present invention generally relates to an improved apparatus for supporting a workpiece during a manufacturing process. The present invention more particularly relates to an improved wafer boat for holding at least one semiconductor wafer.

During manufacturing processes for producing integrated circuit devices on the surface of one or more semiconductor wafers, the wafers must be maintained in a predetermined orientation. The wafers are preferably maintained upright, in a non-touching orientation, in order to minimize the risk of contamination or damage to the wafers.

Many semiconductor manufacturing processes require extreme environmental conditions. For example, the wafer may be exposed to harsh chemicals such as hydrofluoric acid for etching layers on the surface of the wafer. Also, the wafer may be exposed to extremely high temperatures, as high as hundreds of degrees Celsius. Such high temperatures are used for driving implanted ions into the active layers of the wafer and in other processing steps. The apparatus for holding or supporting the wafers must withstand the extreme environmental conditions to which the wafers are exposed.

For holding or supporting semiconductor wafers under the most extreme conditions, a quartz wafer boat has been developed as the industry standard. Quartz has several features which make it amenable to this purpose. Quartz has a high melting point, so it is able to withstand the extreme temperatures used in wafer processing. Quartz is relatively impervious to the chemicals used in semiconductor processing. Quartz is not subject to outgassing, or the driving off of some of the impurities in the quartz itself during heating. These impurities may contaminate the wafers which the quartz boat is holding. Another material used for making wafer boats, having similar properties, is fused silica.

A quartz wafer boat is generally made by welding together a number of quartz members such as tubes or rods. The tubes may be hollow to reduce the weight and cost of the wafer boat. The tubes or rods are generally round in cross-section. Members are generally substantially transparent. A series of co-planar grooves is cut into some of the members. Semiconductor wafers are placed into the grooves, which maintain the wafers in a predetermined, non-touching generally upright orientation on the wafer boat.

It is desirable to uniquely identify a wafer boat. Identifying the wafer boat identifies the wafers it holds, which is important for tracking the progress of the wafers through the manufacturing process. Identifying the wafer boat is also important for correlating the performance or electrical characteristics of the finished integrated circuit devices on a wafer with processing conditions. If a statistically significant number of wafers from the same boat exhibit a similar characteristic, conclusions can be drawn about the processing experienced by the wafers held by that boat. Further conclusions can be drawn if wafers on different boats exhibit different characteristics.

However, because of the extreme processing conditions to which the wafers, and the wafer boat, are exposed, it has heretofore been difficult to reliably identify a wafer boat. Any means for identifying the wafer boat must withstand the same processing conditions as the wafer boat and still be legible after processing. Thus, paper or plastic or metal identifying tags would be inappropriate, as they would burn or melt at high temperatures. In addition, any means for identifying the wafer boat should exhibit the same desirable characteristics of the quartz used to fashion the wafer boat, such as high melting point and resistance to outgassing. Still further, because of the extreme processing conditions, any means for identifying the wafer boat must have chemical, mechanical and thermal properties similar to the quartz used to fashion the wafer boat. For example, the means for identifying the boat should have substantially the same thermal expansion properties as the quartz boat to prevent cracking, breaking or other damage during heating and cooling.

One technique currently used for identifying a wafer boat is marking one or more of the quartz members with a vibrating pencil or a laser. A code, including one or more letters or numbers, is etched or inscribed on the surface of the quartz member. Another technique involves welding a substrate to the quartz member to form identifying characters.

These prior art identification techniques have had several shortcomings, however. Since the quartz members are generally round in cross-section, marking the quartz with either a vibrating pencil or a laser is difficult. Welding is labor-intensive and greatly adds to the cost of the wafer boats, which may be discarded after only a few process runs. When letters or numbers are inscribed on the surface of the quartz, the letters or numbers are visible within only a narrow viewing angle. Inscribed letters and numbers generally cannot be read automatically, but must be read by a human operator, limiting the possibilities for process automation. All of these prior art marking techniques degrade as a result of processing, as the surface of the quartz becomes pitted and inscribed or welded figures become difficult or impossible to read.

Accordingly, there is a need in the art for a wafer boat identification system for identifying a wafer boat, for withstanding extreme processing and environmental conditions, and susceptible to automatic reading of the identifying code.

SUMMARY OF THE INVENTION

The invention therefore provides an improved apparatus for supporting a workpiece during a manufacturing process involving the workpiece. The apparatus includes a holding device for maintaining the workpiece in a predetermined orientation during performance of the manufacturing process, the holding device including a plurality of members. At least one member of the plurality of members has a plurality of indicators arranged in a predetermined order to establish an identifying code. Each indicator of the plurality of indicators absorbs a predetermined portion of light which strikes or is incident upon the indicator. As a result of the absorption of a predetermined portion of incident light, each indicator has a predetermined visual characteristic, such as color.

The invention further provides an improved wafer boat for holding at least one semiconductor wafer in a predetermined orientation. The wafer boat includes a plurality of members. At least one member of the plurality of members has a plurality of indicators arranged in a predetermined order to establish an identifying code. Each indicator of the plurality of indicators absorbs a predetermined portion of light which strikes or is incident upon the indicator.

The invention still further provides a method for establishing an input parameter for a manufacturing process for a product. The input parameter produces a predetermined effect on the product. The manufacturing process is for manufacturing a plurality of lots of the product. The method includes the steps of arranging a first lot on a first frame and a second lot on a second frame; providing the first frame with a first plurality of indicators arranged in a first predetermined order to establish a first identifying code; providing the second frame with a second plurality of indicators arranged in a second predetermined order to establish a second identifying code, each indicator of the first plurality and the second plurality of indicators absorbing a predetermined portion of incident light; establishing the input parameter at a first value; processing the first lot and the second lot according to the manufacturing process, the input parameter producing a first effect on the first product and a second effect on the second product; and varying the input parameter from the first value to the second value to minimize the difference between the first effect and the second effect.

It is therefore an advantage of the present invention to provide an apparatus for holding a workpiece during a manufacturing process, the apparatus including an identifying code.

It is a further advantage of the present invention to provide a means for identifying an apparatus for supporting a workpiece, such as a wafer boat, which is substantially resistant to environmental and manufacturing extremes of temperature and other parameters.

It is a still further advantage of the present invention to provide a means for identifying an apparatus for holding a workpiece, such as a wafer boat, which may be visually determined automatically, without human intervention.

Further advantages and features of the present invention will be apparent from the following specification and claims when considered in connection with the accompanying drawings illustrating the preferred embodiment of the invention.

DETAILED DESCRIPTION OF THE DRAWINGS

DETAILED DESCRIPTION OF THE INVENTION

Figure 1:
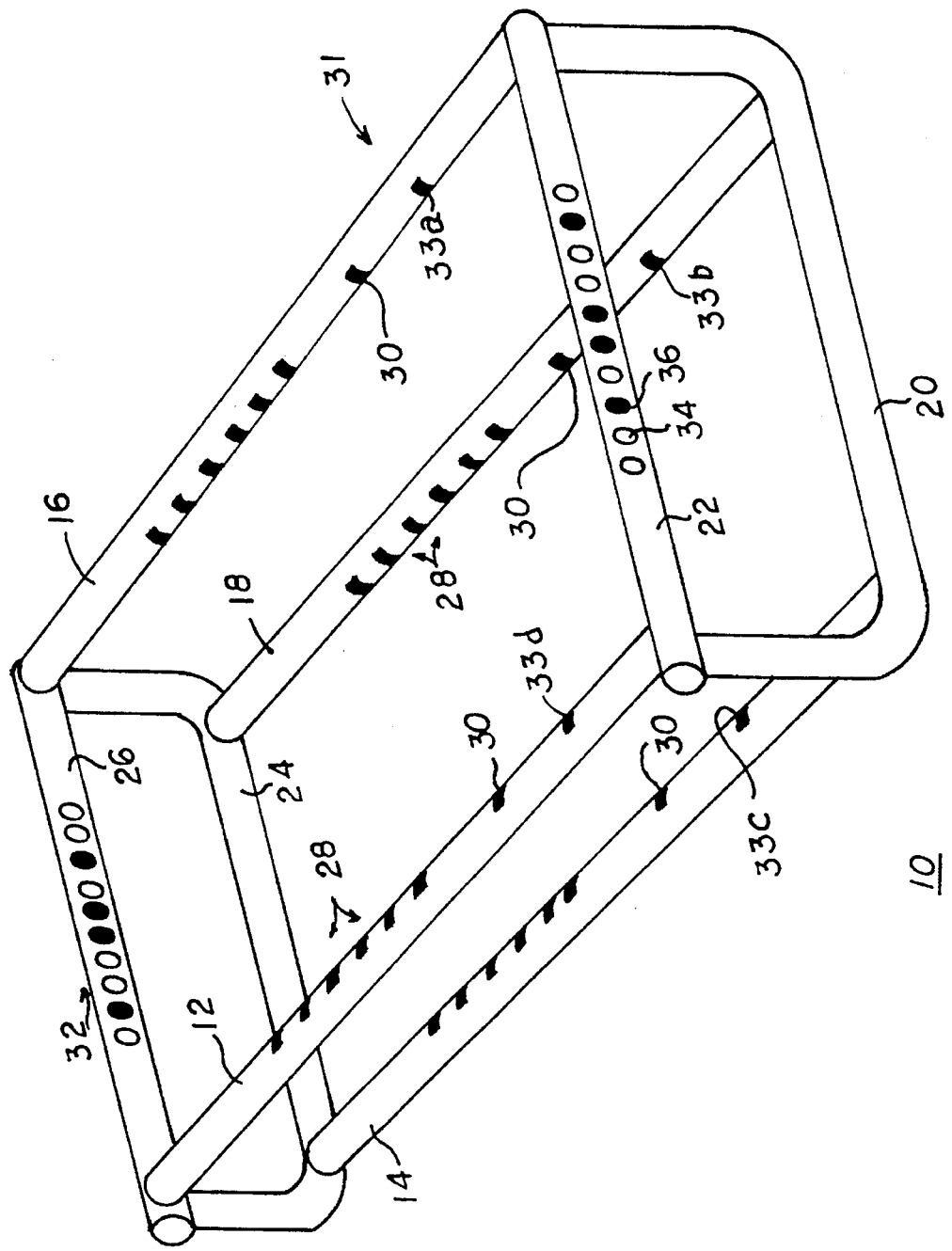
FIG. 1 is a perspective view of an apparatus embodying the present invention.

FIG. 1 is a perspective view of an apparatus 10 for supporting a workpiece (not shown) during a manufacturing process involving the workpiece. As illustrated in FIG. 1, the apparatus 10 is in the form of a wafer boat for holding one or more semiconductor wafers (not shown) during manufacturing. However, it is to be understood that the present invention is not limited to a wafer boat, but may used with any apparatus for supporting a workpiece during a manufacturing process. However, for purposes of clarity in describing the exemplary embodiment of the present invention illustrated in FIG. 1, apparatus 10 will hereinafter be referred to as wafer boat 10.

The wafer boat 10 preferably includes a plurality of members, such as side members 12, 14, 16 and 18; a first end member 20; a first pick-up tube 22; a second end member 24; and a second pick-up tube 26. Each of the plurality of members may be fashioned from rods or hollow tubes or rods including hollow portions. Further, each of the members preferably has a substantially round or elliptical cross section, although square, rectangular or other rectilinear cross-sections are within the purview of the present invention.

Each of the plurality of members is preferably fabricated from a material which is substantially impervious to environmental and processing conditions to which the wafer boat 10 may be exposed. For holding semiconductor wafers during processing of the wafers, the wafer boat 10 is preferably fabricated from quartz or fused silica. The individual members 12, 14, 16, 18, 20, 22, 24 and 26 are preferably welded together in a manner well known in the art.

Each of the side members 12, 14, 16 and 18 preferably includes a plurality of grooves 28. Each groove 30 is preferably cut into the surface of the side members 12, 14, 16 and 18, and is preferably sized to receive a semiconductor wafer. The grooves 30 in each of the side members 14, 16, 18 and 20 are preferably arranged in co-planar sets to maintain respective semiconductor wafers in a predetermined orientation during the manufacturing process. In FIG. 1, a set 31 of grooves includes co-planar grooves 33a, 33b, 33c and 33d. For example, the co-planar sets of grooves 30 may maintain a semiconductor wafer substantially vertical and in a non-touching orientation.

The first pick-up tube 22 and the second pick-up tube 26 each preferably includes a plurality of indicators 32. The plurality of indicators are arranged in a predetermined order to establish an identifying code. For example, the plurality of indicators 32 may include one or more markers such as marker 34 with a first characteristic, such as a first color, and one or more markers such as marker 36 with a second characteristic, such as a second color. The first and second characteristics are preferably different. For example, marker 34 may be substantially transparent and marker 36 may be substantially opaque, or marker 34 may be a first color and marker 36 may be a second, different color. The characteristics may be related to other parameters, such as process type, product, manufacturer or simply an identifying number.

The plurality of indicators 32 preferably exhibit two visual characteristics to establish a binary code. However, the plurality of indicators 32 may have more than a first characteristic and a second characteristic and establish an identifying code which is other than binary in nature. Also, FIG. 1 illustrates both the first pick-up tube 22 and the second pick-up tube 26 including a plurality of indicators 32. However, the plurality of indicators 32 may optionally be provided in only one of the first pick-up tube 22 or the second pick-up tube 26. Alternatively, the plurality of indicators 32 may be provided to one or more of the other members 12, 14, 16, 18, 20 or 24.

FIG. 2 is a series of views of a portion of the apparatus 10 of FIG. 1 showing alternative embodiments of the present invention. The preferred embodiment of the present invention is illustrated in FIG. 2a. In FIG. 2a, the first pick-up tube 22 includes a hollow portion 38. The hollow portion 38 may be sealed at each end by a first end cap 40 and a second end cap 42. Alternatively, the portions of the first pick-up tube 22 other than the hollow portion 38 may be filled, or the entire first pick-up tube 22 may be hollow. The hollow portion 38 is preferably substantially transparent.

The hollow portion 38 contains the plurality of indicators 32. To establish an identifying code, the plurality of indicators 32 includes one or more markers 34 having a first characteristic, such as a first visual characteristic, such as a first color, and one or more markers 36 having a second characteristic, such as a second visual characteristic, such as a second color. For example, the markers 34 having the first characteristic may be substantially clear, and the markers 36 having the second characteristic may be substantially opaque.

Each indicator of the plurality of indicators 32 preferably absorbs a predetermined portion of incident light. Each of the markers thus transmits or reflects a second different portion of incident light. For example, a marker which appears red in color transmits or reflects red light while absorbing all other incident light. For example, the markers 34 having the first characteristic, which are substantially clear, transmit substantially all incident light. In contrast, the markers 36 having the second characteristic, which may be substantially opaque, absorb substantially all incident light and transmit substantially no incident light.

In an alternative embodiment, the markers 34, 36 may absorb a predetermined frequency range of incident light, and therefore have a respective color, such as red or blue. Still further, the markers 34, 36 may transmit no light at all, but may be colored on their exterior surface to reflect only a predetermined portion of incident light or a predetermined frequency range of incident light and absorb substantially all other incident light.

Figure 2A:
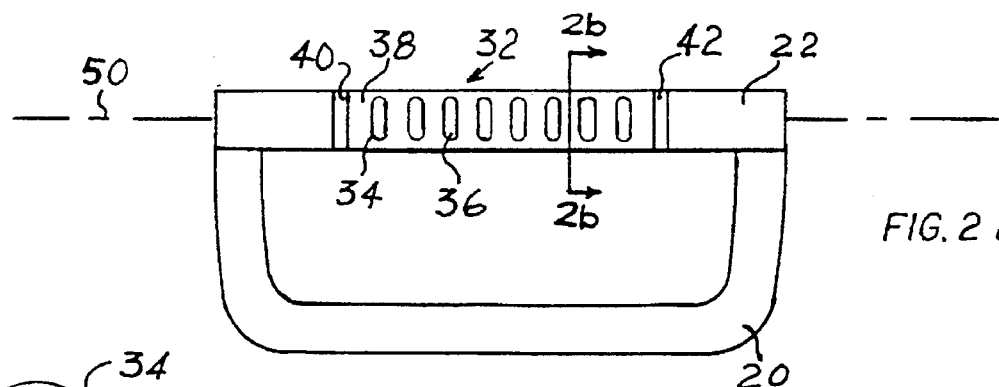
FIG. 2 is a series of views of a portion of the wafer boat of FIG. 1 showing alternative embodiments of the present invention.

In accordance with the preferred embodiment of the present invention illustrated in FIG. 2a, the plurality of indicators includes a plurality of disks contained within the hollow portion 38 of the first pick-up tube 22. The plurality of disks are preferably fabricated from the same material, such as quartz or fused silica, as the first pick-up tube 22. This assures that during thermal cycling, as the first pick-up tube 22 and the plurality of indicators 32 are heated and cooled, the first pick-up tube 22 and the plurality of indicators 32 will expand and contract at a substantially similar rate, minimizing the risk of cracking or breaking or other damage to the first pick-up tube 22 and the plurality of indicators 32. The plurality of indicators 32 may each be welded to the inside of hollow portion 38 of the first pick-up tube 22, in order to reduce the risk of damage due to jostling or jarring, or may be left loose within the hollow portion 38, or may be held in place by the first end cap 40 and the second end cap 42.

Figure 2B:
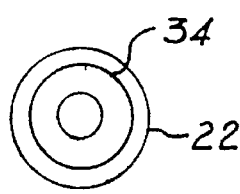

FIG. 2b is a cross-sectional view along line B—B in FIG. 2a. FIG. 2b shows marker 34 located within first pickup tube 22. Marker 34 may be annular, as illustrated in FIG. 2b, or may be a filled solid.

Figure 2C:
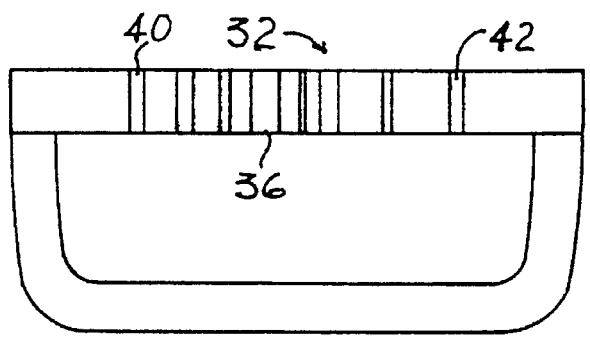

FIG. 2c shows a first alternate embodiment of the present invention. In FIG. 2c, the widths of the plurality of indicators 32 are varied to establish a code similar to a bar code.

Figure 2D:
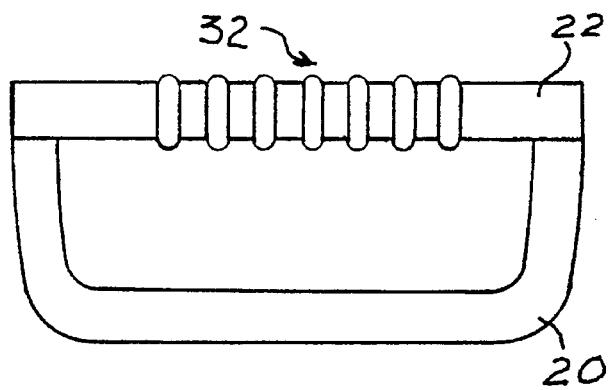

FIG. 2d illustrates a second alternate embodiment of the present invention. In FIG. 2d, the plurality of indicators 32 is in the form of a plurality of rings attached to the outside surface of the first pick-up tube 22. The rings may be welded in place or held in some other manner. As in FIG. 2a, the plurality of indicators 32 is arranged in a predetermined order to establish an identifying code, such as a binary code.

Figure 2E:
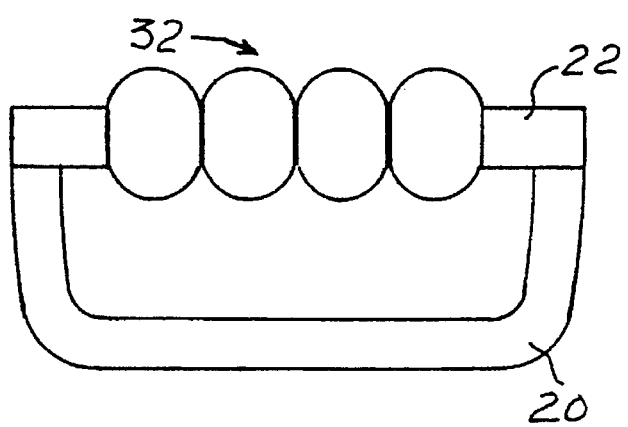

FIG. 2e shows a third alternate embodiment of the present invention. In FIG. 2e, the plurality of indicators 32 is in the form of fused beads or marbles which form a portion of the structure of the first pick-up tube 22. As in FIG. 2a, 2c and 2d, the plurality of indicators are arranged in a predetermined order to establish an identifying code, such as a binary code.

As can be seen from FIGS. 2a–2e, a means for identifying the wafer boat 10 is easily legible at a wide viewing angle. That is, the code established by the plurality of indicators 32 can easily be read from substantially 360° around the center line 50 of the first pick-up tube 22. Also, the code can easily be read at some distance. Moreover, the binary or other code can be read by an operator or can be read automatically, for example, by a machine.

Figure 3:
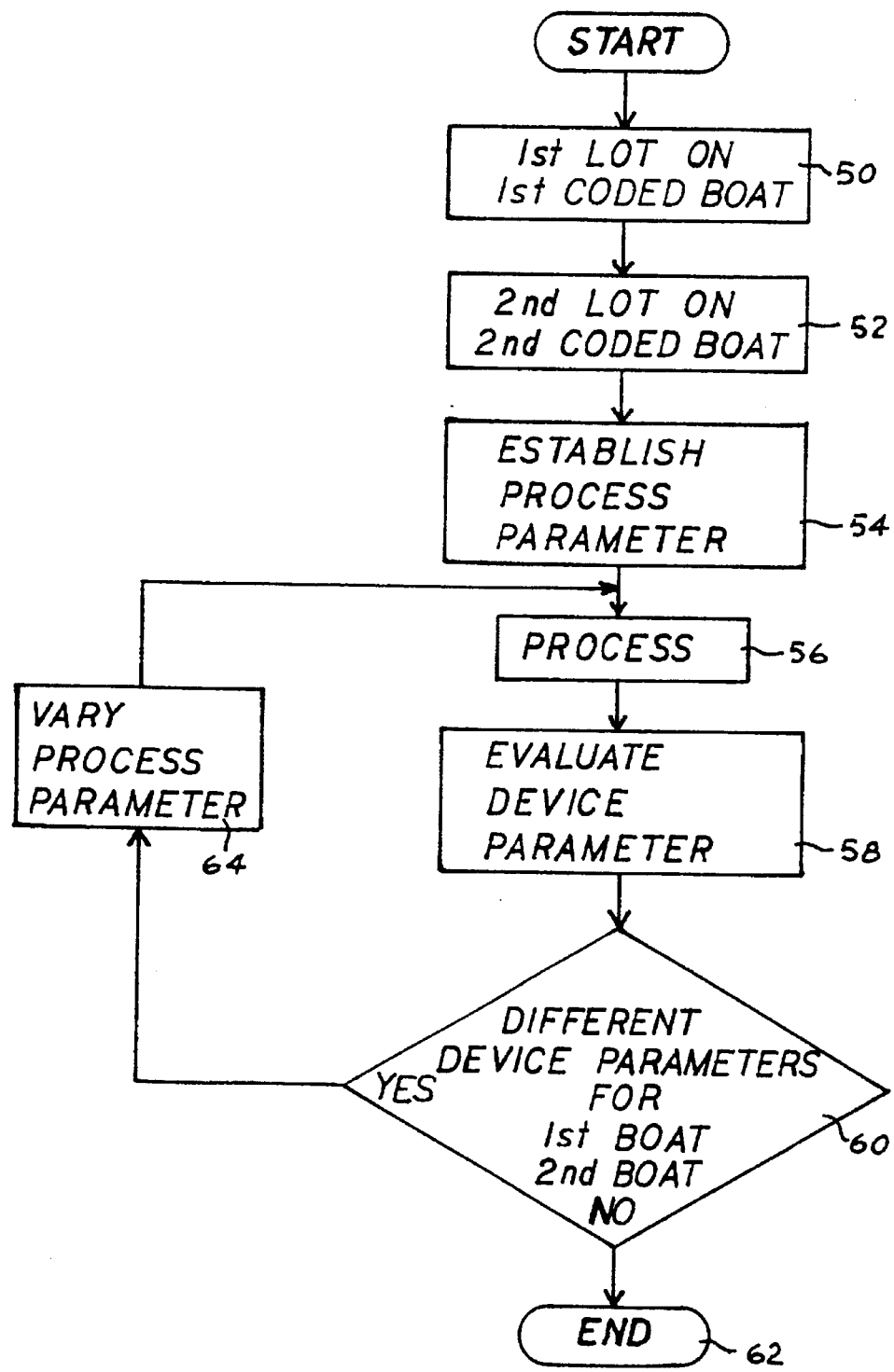
FIG. 3 is a flow diagram illustrating a method in which the apparatus of FIG. 1 may be used to advantage.

FIG. 3 is a flow diagram illustrating a method in which the apparatus 10 of FIG. 1 may be used to advantage. FIG. 3 illustrates a method for establishing an input parameter for a manufacturing process for a product such as semiconductor devices on the surface of one or more semiconductor wafers. The semiconductor wafers are preferably maintained on a plurality of wafer boats such as the wafer boat 10 of FIG. 1. However, it is to be understood that the method of FIG. 3 should not be limited solely to a manufacturing process for semiconductor devices.

The method begins at step 50 where a first lot of semiconductor wafers is loaded on a first coded wafer boat, such as wafer boat 10. At step 52, a second lot of wafers is loaded on a second coded wafer boat, such as wafer boat 10. The identifying codes established for the first coded wafer boat and the second coded wafer boat by the respective pluralities of indicators 32 are preferably different, so that the first coded boat and the second coded boat are each uniquely identified. The first lot of wafers and the second lot of wafers preferably each include one or more semiconductor wafers for processing.

The method continues at step 54, where one or more processing parameters is established. The processing parameter may be a time or a temperature or any other processing parameter to which the semiconductors wafers are subjected. At step 56, the semiconductor wafers are processed according to the process parameter established as step 54. For example, if the process parameter is a furnace temperature setting to be established during a dopant drive-in phase of the manufacturing process, at step 56, the dopant drive-in occurs.

At step 58, one or more device parameters are evaluated to determine the effect of the processing of step 56. For example, electrical parameters such as sheet resistances and turn-on voltages may be measured to determine the electrical characteristics of devices fabricated during step 56.

At step 60, it is determined whether there is a difference between device parameters measured from wafers maintained on the first coded boat and device parameters measured from wafers maintained on the second coded boat. For example, non-uniform furnace heating may result in a temperature gradient in the furnace, producing localized hot or cool spots within the furnace where the temperature varies from an expected temperature. Wafers maintained on a wafer boat located in such a hot or cool spot will include devices exhibiting device parameters, such as sheet resistance or junction depth, which are different from device parameters of devices fabricated on wafers maintained on a wafer boat located in an area of the furnace having the expected temperature. Thus, the identifying code established on the first coded boat and the second coded boat may be associated with the effects produced on the first lot of wafers and the second lot of wafers, respectively.

If there is no substantial difference between the measured device parameters for wafers contained on the first coded boat and the second coded boat, the method ends at step 62. If there is a substantial difference, at step 64 the process parameter established at step 54 (such as a furnace temperature) is varied to minimize the difference between the device parameters measured at step 58 for the first lot of wafers and the second lot of wafers. Steps 54, 56, 58, 60 and 64 may be repeated until the measured parameter differences between the first lot of wafers and the second lot of wafers are acceptably minimized. Alternatively, after step 64, process flow could return to step 50 and separate lots of wafers may be processed according to the new process parameter.

As can be seen from the foregoing, the present invention provides an improved apparatus for supporting a workpiece. The apparatus includes a plurality of indicators establishing an identifying code. The code may be easily read at a wide viewing angle and may be automatically read (e.g., read by a machine). The identifying means is preferably fabricated from the same or similar material as the structural members of the apparatus to provide durability when subjected to extreme processing or environmental conditions.

It is to be understood that, while the detailed drawings and specific examples given describe preferred embodiments of the invention, they are for the purpose of illustration only, that the apparatus of the invention is not limited to the precise details and conditions disclosed, and various changes may be made therein without departing from the spirit of the invention which is defined by the following claims.

We claim:

1. An improved apparatus for supporting a workpiece during a manufacturing process involving said workpiece, the apparatus including a holding device for maintaining said workpiece in a predetermined orientation during performance of said manufacturing process, said holding device including a plurality of members, wherein the improvement comprises:

at least one member of said plurality of members including a plurality of indicators arranged in a predetermined order to establish in identifying code, each indicator of said plurality of indicators absorbing a predetermined portion of incident light, wherein at least a portion of said at least one member is hollow and substantially transparent and wherein said plurality of indicators are located within said hollow portion of said member.

2. An improved apparatus for supporting a workpiece during a manufacturing step on said workpiece as recited in claim 1 wherein said indicators are comprised of a plurality of disk-like markers.

3. An improved wafer boat for holding at least one semiconductor wafer in a predetermined orientation as recited in claim 2 wherein said plurality of indicators comprises a plurality of markers, each marker of said plurality of markers having one color of at least a first color and a second color.

4. An improved apparatus for supporting a workpiece during a manufacturing step on said workpiece as recited in claim 1 wherein said each indicator absorbs a predetermined frequency range of said incident light.

5. An improved wafer boat for holding at least one semiconductor wafer in a predetermined orientation, said wafer boat including a plurality of members, wherein the improvement comprises:

at least one member of said plurality of members including a plurality of indicators arranged in a predetermined order to establish an identifying code, each indicator of said plurality of indicators absorbing a predetermined portion of incident light, wherein at least a portion of said at least one member is hollow and substantially transparent and wherein said plurality of indicators are located within said hollow portion of said member.

6. An improved wafer boat for holding at least one semiconductor wafer in a predetermined orientation as recited in claim 5 wherein said plurality of indicators are comprised of a plurality of disk-like markers.

7. An improved wafer boat for holding at least one semiconductor wafer in a predetermined orientation as recited in claim 6 wherein said plurality of indicators comprises a plurality of markers, each marker of said plurality of markers having one color of at least a first color and a second color.

8. An improved wafer boat for holding at least one semiconductor wafer in a predetermined orientation as recited in claim 5 wherein said each indicator absorbs a predetermined frequency range of said incident light.

9. An improved apparatus for supporting a workpiece during manufacturing process involving said workpiece, the apparatus including a holding device for maintaining said workpiece in a predetermined orientation during performance of said manufacturing process, said holding device including a plurality of members, wherein the improvement comprises:

at least one member of said plurality of members including a plurality of indicators arranged in a predetermined order to establish an identifying code, each indicator of said plurality indicators absorbing a predetermined portion of incident light, wherein said at least one member has an outside surface, wherein said plurality of indicators are attached around said outside surface of said at least one member.

10. An improved apparatus for supporting a workpiece during the manufacturing step on said workpiece as recited in claim 9 wherein said outside surface is circular.

11. An improved apparatus for supporting a workpiece during the manufacturing step on said workpiece as recited in claim 9 wherein said plurality of indicators are ring-like markers attached around the outside surface.

12. An improved apparatus for supporting a workpiece during the manufacturing step on said workpiece as recited in claim 10 wherein said plurality of indicators comprise a plurality of markers, each of said plurality of markers having one color of at least a first color and a second color.

13. An improved apparatus for supporting a workpiece during the manufacturing step on said workpiece as recited in claim 9 wherein said each indicator absorbs a predetermined frequency range of incident light.

14. An improved apparatus for supporting a workpiece during the manufacturing step on said workpiece as recited in claim 9 wherein said apparatus is a wafer boat.

15. An improved apparatus for supporting a workpiece during the manufacturing step on said workpiece as recited in claim 14 wherein said workpiece is a semiconductor wafer.

* * * * *